United States Patent
Ko

(10) Patent No.: US 6,876,018 B2
(45) Date of Patent: Apr. 5, 2005

(54) ORGANIC LIGHT-EMITTING DIODE DEVICES HAVING REDUCED AMBIENT-LIGHT REFLECTION AND METHOD OF MAKING THE SAME

(75) Inventor: Chung-Wen Ko, Hsi Chi (TW)

(73) Assignee: AU Optronics, Corp., Hsinchu (TW)

( * ) Notice: Subject to any disclaimer, the term of this patent is extended or adjusted under 35 U.S.C. 154(b) by 34 days.

(21) Appl. No.: 10/419,903

(22) Filed: Apr. 22, 2003

(65) Prior Publication Data

US 2004/0124432 A1 Jul. 1, 2004

(30) Foreign Application Priority Data

Dec. 25, 2002 (TW) ........................ 91137342 A

(51) Int. Cl.[7] ............................................. H01L 29/861
(52) U.S. Cl. .................... 257/290; 257/80; 257/414; 257/431
(58) Field of Search ............................. 257/21, 53, 80, 257/88, 290, 414, 431, E31.099, E31.105, E51.022

(56) References Cited

U.S. PATENT DOCUMENTS

| 6,339,290 B1 * | 1/2002 | Nakaya | 313/506 |
| 6,513,451 B2 * | 2/2003 | Van Slyke et al. | 118/723 VE |
| 6,815,723 B2 * | 11/2004 | Yamazaki et al. | 257/88 |
| 2001/0031380 A1 * | 10/2001 | Yoon et al. | 428/690 |
| 2002/0185969 A1 * | 12/2002 | Raychaudhuri et al. | 313/506 |
| 2003/0143428 A1 * | 7/2003 | Kim et al. | 428/690 |
| 2003/0224203 A1 * | 12/2003 | Raychaudhuri et al. | 428/690 |
| 2003/0224204 A1 * | 12/2003 | Raychaudhuri et al. | 428/690 |

* cited by examiner

Primary Examiner—George Fourson
Assistant Examiner—Joannie A. Garcia
(74) Attorney, Agent, or Firm—Troxell Law Office, PLLC

(57) ABSTRACT

A method of manufacturing an organic light-emitting device having reduced ambient-light reflection is disclosed. The method comprises the following steps. First, a metal reflective layer is formed on a provided substrate. Then a transparent anode, an organic layer, a translucent electron-injecting cathode, a buffer layer and a transparent electrode are sequentially deposited on the metal reflective layer. In order to reduce the affect of the ambient-light reflection, adjusting the thickness of the aforementioned layers that the reflected lights generate destructive optical interference and improve the visually perceived contrast of the emitted light.

3 Claims, 3 Drawing Sheets light emission light emission

ORGANIC LIGHT-EMITTING DIODE DEVICES HAVING REDUCED AMBIENT-LIGHT REFLECTION AND METHOD OF MAKING THE SAME

BACKGROUND OF THE INVENTION (1) Field of the Invention

The invention relates to the organic light-emitting diode devices, and more particularly to the organic light-emitting diode devices having reduced ambient-light reflection and methods for making the same.

(2) Description of the Prior Art

Owing to high brightness, fast response speed, light weight, thin and small features, full color, no viewing angle differences, no need for an LCD back-light board and low electrical consumption, an organic light emitting diode display or organic electroluminescence display (OLED) takes the lead to substitute a twist nematic (TN) or a super twist nematic (STN) liquid crystal display. Further, it substitutes for a small-sized thin-film transistor (TFT) LCD to become a new display material of fabricating portable information products, cell phones, personal digital assistant (PDA) and notebook.

Referring to FIG. 1, an organic light-emitting diode (OLED), also referred to as an organic electroluminescent (EL) device is constructed in a normal configuration on a light-transmissive substrate 10 through which the light emitted by the device is viewed, and a light-transmissive anode 12, an organic layer 14 are sequentially deposited thereon. The organic layer 14 comprises, in sequence, a hole-injecting layer (HIL), a hole-transporting layer (HTL), an emitting layer (EML) and an electron-transporting layer (ETL). Next a reflective metal cathode 16 is deposited thereon. When an electrical potential is placed across the electrodes, holes and electrons are injected into the organic zones from the anode and cathode, respectively. Light emission results from hole-electron recombination within the device and one part of light emitting through the light-transmissive substrate 10 and anode 12. And the other part of light will reflect by the reflective metal cathode 16 then also emit through the light-transmissive substrate 10 and anode 12. This kind of emission type is what we called "bottom emission." On the contrary, if the light-transmissive anode 12 is deposited on a reflective substrate (or having a reflective metal layer on a light-transmissive substrate) then deposited same organic layer and a light-transmissive cathode that light will emit through the light-transmissive cathode. And this kind of emission type is so called "top emission."

The foregoing of two emission types are all with the reflective metal electrode which is to improve brightness of emission from which internally generated light from the organic layer is reflected and directed toward the light-transmissive substrate. However, such a metallic electrode also reflects ambient-light entering the device structure through the light-transmissive substrate and the light-transmissive electrode, thereby degrading the visually perceived contrast of the emitted light, as viewed by an observer. Therefore, to avoid the ambient reflected light, a well known approach is depositing a "black cathode" (made by ZnO) which is a light absorptive and electric conductive material between the organic layer and the reflective cathode. And using the black cathode absorbs the ambient-light thereby reducing ambient-light reflection. Another well-known approach does not absorb the ambient-light. As shown in FIG. 2, a "black layer" 26 is deposited between the organic layer 22 and the metal cathode 28. By adjusting the thickness of the black layer 26, destructive optical interference of the reflected ambient-light is generated by the translucent electron-injecting cathode 24 and metal cathode 28, thereby reducing ambient-light reflection.

Either the black cathode or the black layer, the conductivity thereof is considerate. If materials are bad in conductivity, the applying voltage must increase. Further, the black layer comprises multi-layer, not only the conductivity but also the refractive index are the challenges to be dealt with. Additionally, one more layer we have, more time and cost we spend. Concerning about time to market, the OLED device that has less layers is more competitive. Thus, the present invention provides methods to reduce the ambient-light reflection without increasing layers in the OLED device.

SUMMARY OF THE INVENTION

The first objective of the present invention is to provide a method without adding additional layer in device structure for solving the affect of ambient-light reflection.

The second objective of the present invention is to provide a method for adjusting the thickness of the organic layer and the transparent electrode, thereby reducing the ambient-light reflection for the OLED device.

In the first embodiment, the method comprises the following steps. Firstly, a metal reflective layer is formed on a provided substrate. Then a transparent anode, an organic layer, a translucent electron-injecting cathode, a buffer layer and a transparent electrode are sequentially deposited on the metal reflective layer. In order to reduce the affect of the ambient-light reflection, during the designated deposition procedure, adjusting one or both of the thickness of the organic layer and the transparent anode that the reflected lights generate destructive optical interference and improve the visually perceived contrast of the emitted light.

In the second embodiment of the present invention, different from the first embodiment, the metal anode is directly deposited on the substrate instead of depositing the metal reflective layer and the transparent anode thereon. By adjusting the thickness of the organic layer that the reflected lights generate destructive optical interference and improve the visually perceived contrast of the emitted light.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is the organic light-emitting diode device having reduced ambient-light reflection and method of making the same. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
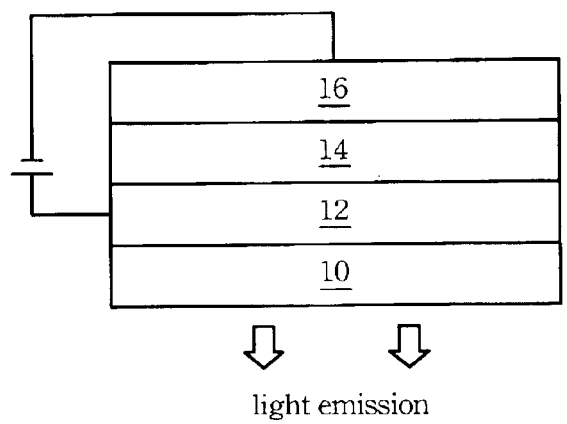
FIG. 1 is a schematic view of a basic structure of the bottom emission type OLED device.
Figure 2:
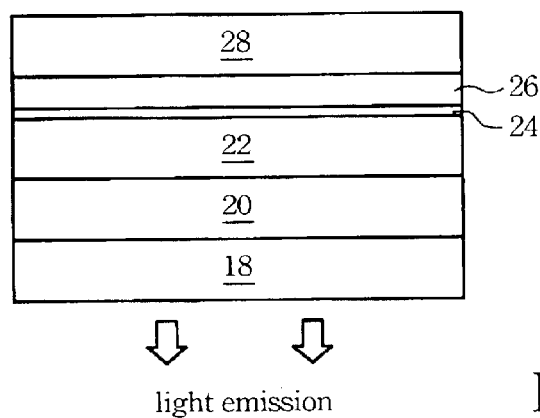
FIG. 2 is a schematic view of a basic structure of the bottom emission type OLED device in accordance with the prior art.
Figure 3:
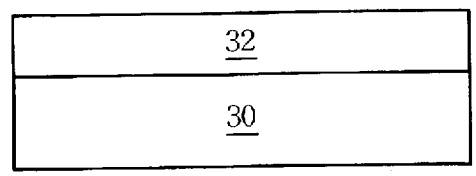
FIG. 3 is a cross sectional view of the transparent substrate illustrating the steps of forming metal reflective layer in accordance with the first embodiment.
Figure 4:
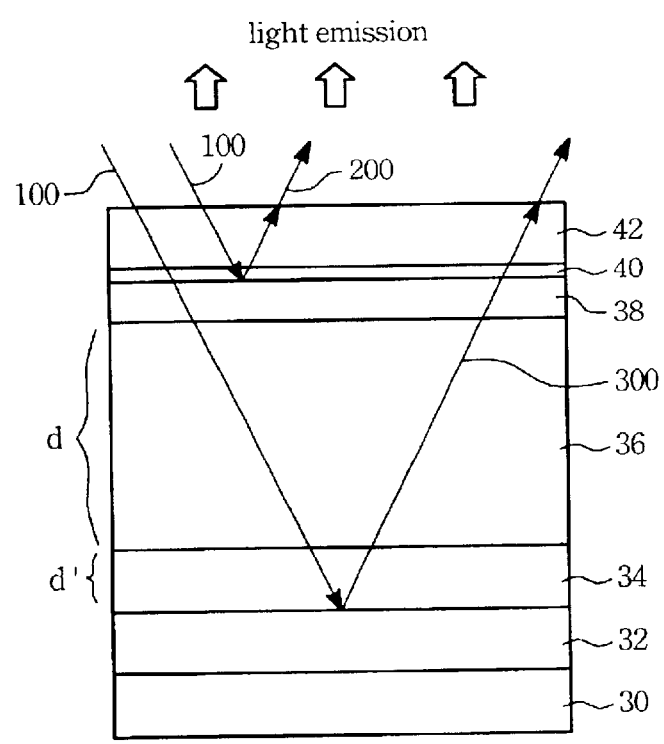
FIG. 4 is a schematic view of a basic structure of the OLED device in accordance with the first embodiment.

Referring to FIG. 4, in the first embodiment of the present invention the OLED device is made for reducing ambient-light reflection. As shown in FIG. 3, firstly, a substrate 30 is provided to form the OLED structure. Then, a metal reflective layer 32 is formed on the substrate 30 by performing a PVD or CVD procedure such as sputtering or evaporation. The aforementioned metal material can be chosen from a good conductor in electricity such as aluminum (Al) and chromium (Cr). To function as a reflecting interface provide a mirror-like surface from which internally generated light from the OLED device.

Subsequently, a transparent anode 34 is formed on the metal reflective layer 32 by performing sputtering, electron beam evaporation, thermal evaporation, chemical vapor deposition or spray pyrolysis. The material of the transparent electrode can be chosen from indium-tin-oxide (ITO) or indium-zinc-oxide (IZO). Then, an organic layer 36 is deposited on the transparent anode 34. The organic material can be selected from the group of Alq, NPB, CuPc, C545T, DCJTB, CBP, BAlq or Ir(ppy)$_3$, etc. And the deposition method can be selected from electron beam evaporation, thermal evaporation, dip coating, spin coating, Langmuir-Boldgett method and Sol-Gel method, etc.

Then, a translucent electron-injecting cathode 38 is formed on the organic layer 36. The material of the aforementioned cathode is chosen from the material with better conductivity, such as alkali metal. But the disadvantage of the alkali metal is unstable. Such that the more stable metallic compound or alloy (e.g. of LiF or Mg—Ag, Al—Li) is adopted by performing a sputtering or evaporation procedure. In the meanwhile, the aluminum is also sputtered or evaporated to effectively reduce the driving voltage. Besides, the thickness of the electron-injecting cathode must thin enough (about 0.5~5 nm) to partially let light pass by. Next, a buffer layer 40 is formed on the translucent electron-injecting cathode 38. Generally, the buffer layer 40 (e.g. of CuPc) is used to protect the under layer, the organic layer 36, while sputtering the transparent electrode 42. Besides, the material of the buffer layer 40 also can be chosen from metal such as Ni, Cu, Mo, Ag, In, W, Au, etc.

Finally, a transparent electrode 42 is formed on the buffer layer 40. In general, the light-transmissive and electric conductive light-transmissive material can be chosen from ITO or IZO by performing sputtering or electron beam evaporation. In a preferred embodiment, the sputtering procedure has lots of advantages such as wide range fabrication and thickness uniformity that the procedure is adopted in mass production.

Referring to FIG. 4, when an electrical potential is applied to the electrodes of the OLED device, the emitted light comes from the organic layer 36, one part of the emitted light will upwardly emit through the transparent electrode 42, and the other part of the emitted light will be reflected by the metal reflective layer 32 then go through the transparent electrode 42. Meanwhile, the incident light 100 coming beyond the OLED device will also be reflected by the metal reflective layer 32 and both of the reflected lights will generate the interference so as to lower the contrast ratio of the OLED device.

In order to reduce the ambient-light reflection, according to the present invention of the first embodiment, as the incident light 100 entering the device structure and passing through the translucent electron-injecting cathode 38, the first reflected light 200 is generated by one part of the incident light reflected from the translucent electron-injecting cathode 38. And the other part of the incident light pass through the translucent electron-injecting cathode 38 and reflected by the metal reflective layer 32 such that the second reflected light 300 is created. It should be noted that by adjusting one or both of the thickness "d" of the organic layer 36 and the thickness "d'" of the transparent anode 34, first reflected light 200 and the second reflected light 300 have a phase difference about 180 degrees and result in destructive optical interference that degrade the effect of reflected light caused by ambient-light so as to improve the visually perceived contrast of the emitted light.

Figure 5:
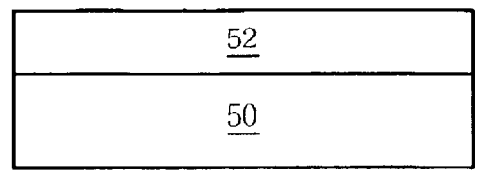
FIG. 5 is a cross sectional view of the transparent substrate illustrating the steps of forming metal anode in accordance with the second embodiment.
Figure 6:
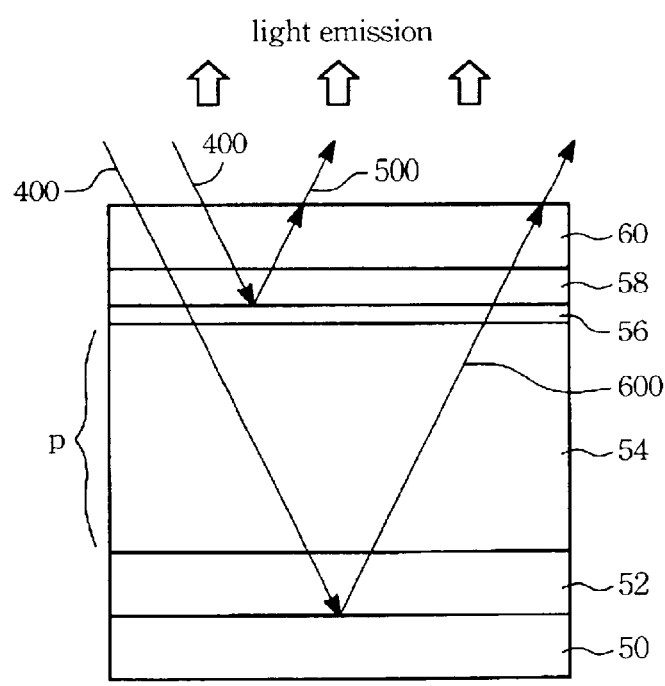
FIG. 6 is a schematic view of a basic structure of the OLED device in accordance with the second embodiment.

As shown in FIG. 6, it is the schematic view of basic structure of the OLED device in accordance with the second embodiment. Referring to FIG. 5, different from the first embodiment, the metal anode 52 is directly deposited on the substrate 50. In general, the metal anode 52 can be selected from the material with well conductivity and greater work function such as nickel (Ni), palladium (Pd), platinum (Pt), gold (Au), silver (Ag), chromium (Cr), alloy and any combination thereof. Then the deposition method can be chosen from sputtering, electron beam evaporation, thermal evaporation deposition, or spray pyrolysis. Next, the organic layer 54, the translucent electron-injecting cathode 56, the buffer layer 58 and the transparent electrode 60 are formed thereon in sequence.

When the incident light 400 enters the OLED device, the translucent electron-injecting cathode 56 and the metal anode 52 can reflect the incident light 400 to separately have a first reflected light 500 and a second reflected light 600. By adjusting the thickness "p" of the organic layer 54, the first reflected light 500 and the second reflected light 600 have a phase difference about 180 degrees and result in destructive interference so as to degrade the effect of reflected light caused by ambient-light and improve the visually perceived contrast of the emitted light.

The aforementioned design in accordance with the present invention has several benefits below:

In the prior art, a black cathode is added in the device structure not only reducing the affect of ambient-light reflection but also absorbing the internally generated light from the organic layer, thereby reducing the emitting efficiency of the OLED. In the present invention, there is no need to apply the black cathode, and the efficiency of light emission is better than that in the prior art.

According to the conventional skill, the additional layer is for reducing the ambient-light reflection. But unfortunately it results in higher cost and lower throughput. In the present invention, the thickness of the organic layer or the transparent anode is optimized to create destructive optical interference of the ambient-light reflection, thereby reducing ambient-light reflection and raising the contrast ratio of the OLED device.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as will as other embodiments, are intended to be included within the scope of the appended claims. The invention is defined by the following claims, with equivalents of the claims to be included therein.

I claim:

1. An organic light-emitting diode (OLED) device having reduced ambient-light reflection comprising:
    a substrate;
    a metal reflective layer provided on said substrate;
    a transparent anode provided on said metal reflective layer;
    an organic layer provided on said transparent anode;
    a translucent electron-injecting cathode provided on said organic layer;
    a buffer layer provided on said translucent electron-injecting cathode; and
    a transparent electrode provided on said buffer layer;
    wherein the ambient-light illuminates said translucent electron-injecting cathode and said metal reflective layer to separately have a first reflected light and a second reflected light,
    wherein by adjusting the thickness of one or both of said organic layer and said transparent anode, said first reflected light and said second reflected light have a phase difference about 180 degrees and result in destructive interference so as to degrade the effect of reflected light caused by ambient-light and improve the visually perceived contrast of the emitted light.

2. The organic light-emitting device having reduced ambient-light reflection of claim 1, wherein the thickness of said translucent electron-injecting cathode is about 0.5 to 5 nm.

3. The organic light-emitting device having reduced ambient-light reflection of claim 1, wherein said buffer layer is selected from the group consisting of Ni, Cu, Mo, Ag, In, W and Au.

* * * * *